(12) United States Patent
Kim et al.

(10) Patent No.: US 7,750,295 B2
(45) Date of Patent: Jul. 6, 2010

(54) EXTRACTOR FOR AN MICROCOLUMN, AN ALIGNMENT METHOD FOR AN EXTRACTOR APERTURE TO AN ELECTRON EMITTER, AND A MEASURING METHOD AND AN ALIGNMENT METHOD USING THEREOF

(75) Inventors: Ho Soeb Kim, Chungcheongnam-do (KR); Seung Joon Ahn, Chungcheongnam-do (KR); Dae Wook Kim, Chungcheongnam-do (KR)

(73) Assignee: Cebt Co., Ltd., Chungcheongnam-do (KR)

(*) Notice: Subject to any disclaimer, the term of this patent is extended or adjusted under 35 U.S.C. 154(b) by 160 days.

(21) Appl. No.: 10/538,284

(22) PCT Filed: Dec. 30, 2003

(86) PCT No.: PCT/KR03/02900

§ 371 (c)(1),
(2), (4) Date: Jun. 29, 2005

(87) PCT Pub. No.: WO2004/059690

PCT Pub. Date: Jul. 15, 2004

(65) Prior Publication Data

US 2006/0071175 A1    Apr. 6, 2006

(30) Foreign Application Priority Data

Dec. 30, 2002   (KR) .................... 10-2002-0087224

Dec. 30, 2002   (KR) .................... 10-2002-0087226

(51) Int. Cl.
H01J 37/352 (2006.01)
(52) U.S. Cl. .............. 250/310; 250/396 R; 250/492.2
(58) Field of Classification Search ............. 250/310
See application file for complete search history.

(56) References Cited

U.S. PATENT DOCUMENTS

| | | | |
|---|---|---|---|
| 5,122,663 A * | 6/1992 | Chang et al. ........... | 250/310 |
| 5,627,373 A * | 5/1997 | Keese ................... | 250/310 |
| 5,831,265 A | 11/1998 | Shinkawa ............... | 250/310 |
| 6,288,401 B1 * | 9/2001 | Chang et al. ........... | 250/396 R |
| 6,297,584 B1 | 10/2001 | Kim et al. .............. | 313/293 |
| 6,369,385 B1 | 4/2002 | Muray et al. ........... | 250/306 |
| 6,392,242 B1 | 5/2002 | Perkins et al. | |
| 6,555,830 B1 | 4/2003 | Mankos et al. ........ | 250/492.2 |
| 6,943,507 B2 * | 9/2005 | Winkler et al. ......... | 315/382 |
| 2001/0028037 A1 * | 10/2001 | Suzuki ................... | 250/396 R |

* cited by examiner

*Primary Examiner*—David A. Vanore
*Assistant Examiner*—Phillip A. Johnston
(74) *Attorney, Agent, or Firm*—Bacon & Thomas, PLLC

(57) ABSTRACT

The present invention provides a new extractor for a micro-column and an alignment method of the aperture of the extractor and an electron emitter for a micro-column. Further, the present invention provides a measuring system, a method for measuring, and an alignment method using the principle of the alignment.

13 Claims, 7 Drawing Sheets

EXTRACTOR FOR AN MICROCOLUMN, AN ALIGNMENT METHOD FOR AN EXTRACTOR APERTURE TO AN ELECTRON EMITTER, AND A MEASURING METHOD AND AN ALIGNMENT METHOD USING THEREOF

TECHNICAL FIELD

The present invention relates to an extractor of an electron beam micro-column, and in particular to a method for aligning an extractor aperture with an electron emitter of the micro-column. More specifically, it relates to the extractor and the method for facilitating alignment of a micro-sized extractor aperture with a tip of electron emitter of the micro-column using the electron beam emitted form the tip of the electron emitter of the micro-column.

Further, the present invention relates to a measuring system for determining a position of an object to be measured by directly sensing the electron beam emitted from the electron emitter and measuring the relative position between the electron emitter and the electron beam measuring device.

Further, the present invention relates to a method for locating and aligning an object by sensing the electron beam, and in particular to measuring the relative location of the object by sensing the electron beam emitted from the electron emitter using the measuring device for the electron beam, in order to performing a general alignment more efficiently and to enabling auto-alignment.

BACKGROUND ART

With an aid of an electron beam micro-column on the basis of a lens with a micro-size and an alignment principle, a scanning tunneling microscope, or an electron emitter operated under a micro-alignment positioner was introduced in the second half of the 1980's. In addition to small size and low manufacturing cost, the electron beam micro-column can form a finely concentrated electron beam, so that it improves the electron beam current and high resolution. Thus, it became widely used in the fields of micro-lithography and electron microscope.

The alignment principles used by a micro-column are similar to STMs in that a precision X-Y-Z positioner is used to control a location of a sharp tip, in the case of micro-column the location of the tip of electron emitter, and that the electrons emitted from the tip are used for controlling and measuring the location of the tip.

FIG. 1 is an exploded diagram of an electron emitter 110 and electron optical column 120. The electron emitter 110 includes an electron emitter tip 112, which may be a Zr/O/W Schottky electron emitter tip, such as A single crystal tungsten, hafnium carbide or diamond tip. The electron emitter tip 112 is mounted on a miniature three-axis micro-positioner 114. Micropositioner 114 has a range of movement in the order of tens of micrometers to more than 1 mm in each of the X-Y-Z directions and has sub-nanometer positioning capability. Micropositioner 114 is used to align the electron emitter tip 112 with electron optical column 120. Typical dimensions of miniature the axis micro-positioner 114 are approximately 2×2×1.1 cm.

The typical components of electron optical column 120 include a micro-source lens 122 with an extractor 124 and an anode 128 with apertures of approximately a few micrometers and 100 micrometer in diameter, respectively. The extractor 124 as an extraction electrode is fabricated from a few~a few hundred micrometers thick silicon (Si) membrane with a bore diameter of a few microns. For an optimum lense operation, the electron emitter tip 112 is required to be positioned very closely and precisely aligned to extractor hole 126.

Due to the proximity of emitter source 110 to extractor 124, aligning electron emitter tip 112 to extractor hole 126 is difficult. The problem is exacerbated by the dimension of extractor hole 126 and the overall column dimension. For fine alignment, an STM-type X-Y positioner has been used in vacuum state to scan the tip over the extractor electrode. However, because the location of the electron emitter tip is not easily and precisely measured, this approach requires so much time for alignment with the extractor hole.

Accordingly, there is need for a method to easily and precisely align an electron emitter and an extractor hole of a micro-column. In this regard, International patent application PCT/US1999/25430 proposed the alignment method. However, because the proposed application makes use of four V-grooves for performing the alignment, it requires additional components for precise alignment within a vacuum space, even if such components are exempted out of the vacuum space.

Further, as the alignment between the electron emitter and the extractor hole may be changed after a long use of the micro-column, it is very difficult to sense such change of alignment.

In case of the micro-column, since the object to be measured and/or aligned is very small and requires precise measurement and alignment, it is necessary to repeat the measuring and/or aligning operation. Thus, it consumes time and cost for carrying out the measurement and alignment. Also, it is more difficult to determine and calibrate the assembled micro-column during the use.

DISCLOSURE OF THE INVENTION

Accordingly, in order to solve the above-stated problems, an object of the present invention is to provide an extractor and an alignment method, wherein the alignment of an electron emitter with an extractor aperture can be facilitated by sensing positions of electrons emitted from the electron emitter directly on the extractor, wherein automatic alignment is possible, and wherein accurate and automatic calibration of the alignment can be facilitated after a long-term of using the micro-column.

Another object of the present invention is to provide a measuring system and measurement method using the electron beam, wherein the measurement and the alignment can be facilitated by employing the electron beam emission in the micro-column and a principle for measuring such an electron beam, i.e., directly sensing the electrons (the electron beam) emitted from the electron emitter.

Another object of the present invention is to provide a method which facilitates and automates the alignment of parts and etc. by using an alignment of relative positions between the electron emitter and the electron beam measuring device on the basis of the sensed data.

According to an aspect of the present invention, there is provided an extractor for use in a micro-column, said extractor comprising: a plurality of sensing regions on which electrons of electron beam strike and being electrically conductive; and, insulating portions including insulating material for prevention of the electron flow or low-doped semiconductor for reduction of the electron flow and dividing each of said sensing regions.

According to another aspect of the present invention, there is provided a method for aligning an extractor aperture of the micro-column with a electron emitter, the method comprising steps of: sensing the electron beam emitted from the electron emitter at each of the sensing regions of the extractor; verifying the position of the sensing region being in a state of currently sensing electrons and the amount of the current flow; calculating relative position between the extractor aperture and the electron emitter on the basis of the verified sensing region and the amount of the current flow; and, moving said electron emitter, said extractor, or said electron emitter and said extractor according to said calculated data.

The present invention employs the principle in that the electron beam emitted from the electron emitter irradiates the extractor in a uniform manner although it is not aligned with the extractor aperture and in that the electron beam is the electron flow and its amount can be sensed like electrical current flow. As such, the electron emitter and the extractor aperture can be aligned by sensing the electron beam directly at the extractor and by using positioning means, such as a micro-positioner based on the sensed data. In order to achieve this, the extractor needs a sensing means for accurately sensing position of the striking electron and amount of the electrons. The sensing means used in the present invention is micro-sized and provided on a semiconductor chip. The sensing means includes a metal plate or p-n junction, which is divided into sensing zones and located opposite to the electron emitter. Subdivision of the sensing zones makes it possible to verify the position of the sensing zones sensing the electrons. As will be described herein after, it is possible to align the electron emitter with the extractor aperture in an automatic manner.

According to another aspect of the present invention, there is provided a position measuring system using electron beam measurement, said system comprising: an electron emitter; an electron beam measuring device, including a plurality of sensing regions through which the electrons of the electron beam can be electrically transmitted, and insulating portions including insulating material for prevention of the electron flow or low-doped semiconductor for reduction of the electron flow and dividing each of the sensing regions; connecting portions for electrically conducting the electrons striking on each of the sensing regions; and, measuring portions connected to each of the corresponding sensing regions via said connecting portions and measuring the amount of the electron beam sensed in each of said sensing regions.

According to another aspect of the present invention, there is provided a method for measuring position using electron beam measurement, said method comprising steps of: providing electron emitter at a first side of an object to be measured; providing an electron beam measuring device at a second side of the object to be measured, said electron beam measuring device including a plurality of sensing regions through which the electrons of the electron beam can be electrically transmitted and insulating portions including insulating material for prevention of the electron flow or low-doped semiconductor for reduction of the electron flow and dividing each of the sensing regions; sensing the electrons emitted from said electron emitter in each of the sensing regions; verifying position of the sensing regions being in a state of sensing the electrons in said electron beam measuring device and calculating the amount of the electrons striking each of the sensing regions; and, calculating relative position of the first and the second sides on the basis of the measured data related to the position of each of the sensing regions being in a state of sensing the electrons and the striking amount of the electrons.

According to another aspect of the present invention, there is provide an alignment method using electron beam measurement, said method comprising steps of: providing electron emitter at a first side of an object to be aligned; providing an electron beam measuring device at a second side of the object to be aligned, said electron beam measuring device including a plurality of sensing regions through which the electrons of the electron beam can be electrically transmitted and insulating portions including insulating material for prevention of the electron flow or low-doped semiconductor for reduction of the electron flow and dividing each of the sensing regions; sensing the electrons emitted from said electron emitter in each of the sensing regions; verifying position of the sensing regions being in a state of sensing the electrons in said electron beam measuring device and calculating amount of the electrons striking each of the sensing regions; calculating relative position of the first and the second sides on the basis of the measured data related to the position of each of the sensing regions being in a sensing state and the striking amount of the electrons; and, moving either one of the first or second side, or both the first and second sides on the basis of the verified relative position.

The measuring method and measurement system using the electron beam in accordance with the present invention employ the same principle as described herein before with regard to the extractor and the alignment method using the same. In other words, the position between the electron emitter and the electron beam measuring device is verified by sensing the position of the electron beam in the sensing zones of the electron beam measuring device and the amount of the current flow irradiated onto the sensing zones. In view of the technological principle, steps for sensing the emitted electron directly at the electron beam measuring device and using the sensed data are similar to those carried out in the operation of the micro-column, and more sophisticated alignment and control will be possible by applying those steps. Accordingly, if the alignment of the electron emitter with the electron beam measuring device is performed by positioning means, such as a positioner of the micro-column, more accurate position control, as well as verification of the position, can be done by the electron beam measuring system of the present invention.

BEST MODE FOR CARRYING OUT THE INVENTION

Figure 1:
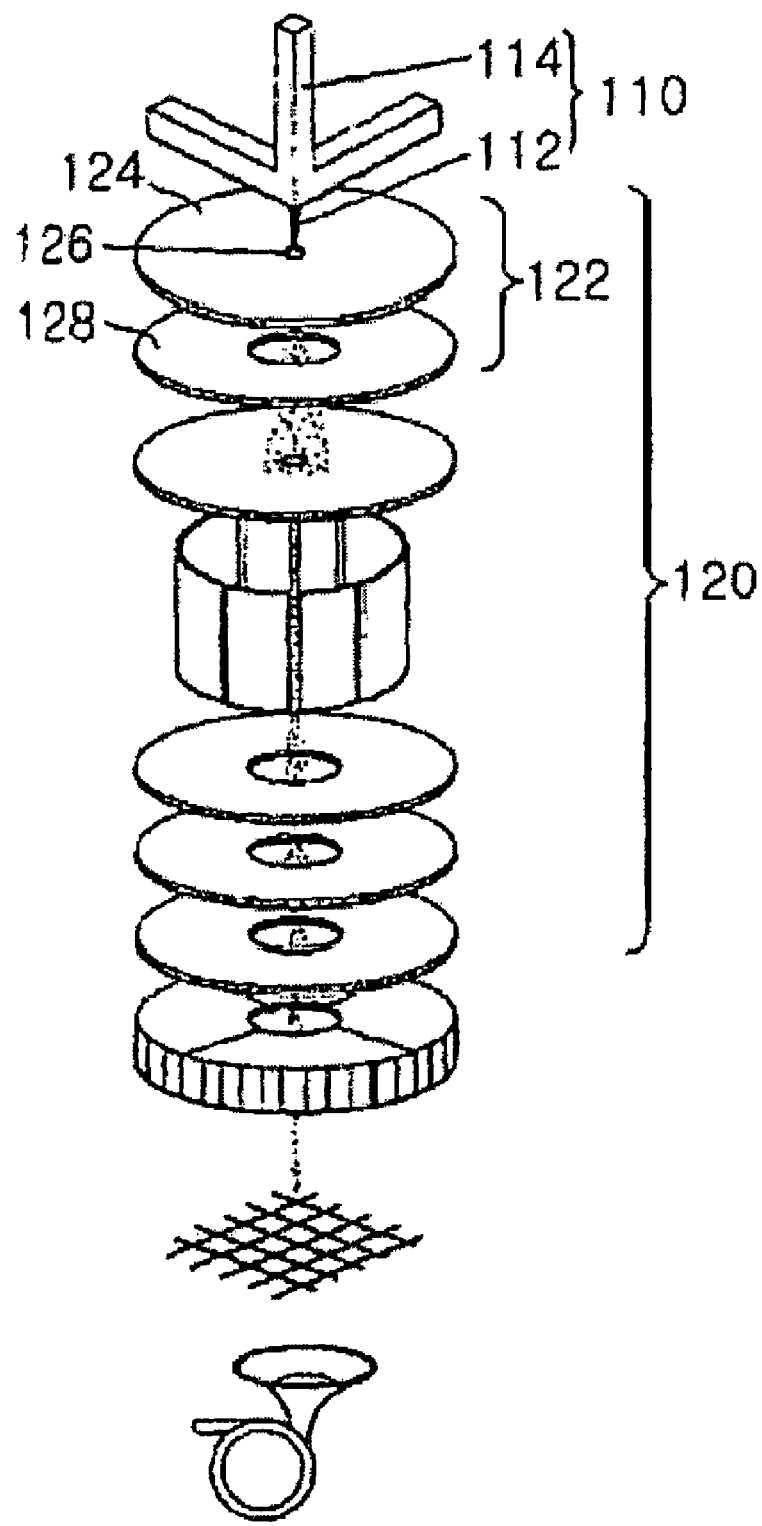
FIG. 1 is an exploded view of a conventional micro-column.

The present invention will become more apparent upon reference to the following description in connection with the accompanying drawings.

Even though the present invention is described with reference to embodiments shown in the drawings, those embodiments should not be construed to limit the present invention. The same reference numerals in the drawings denote the same elements, respectively.

Figure 2:
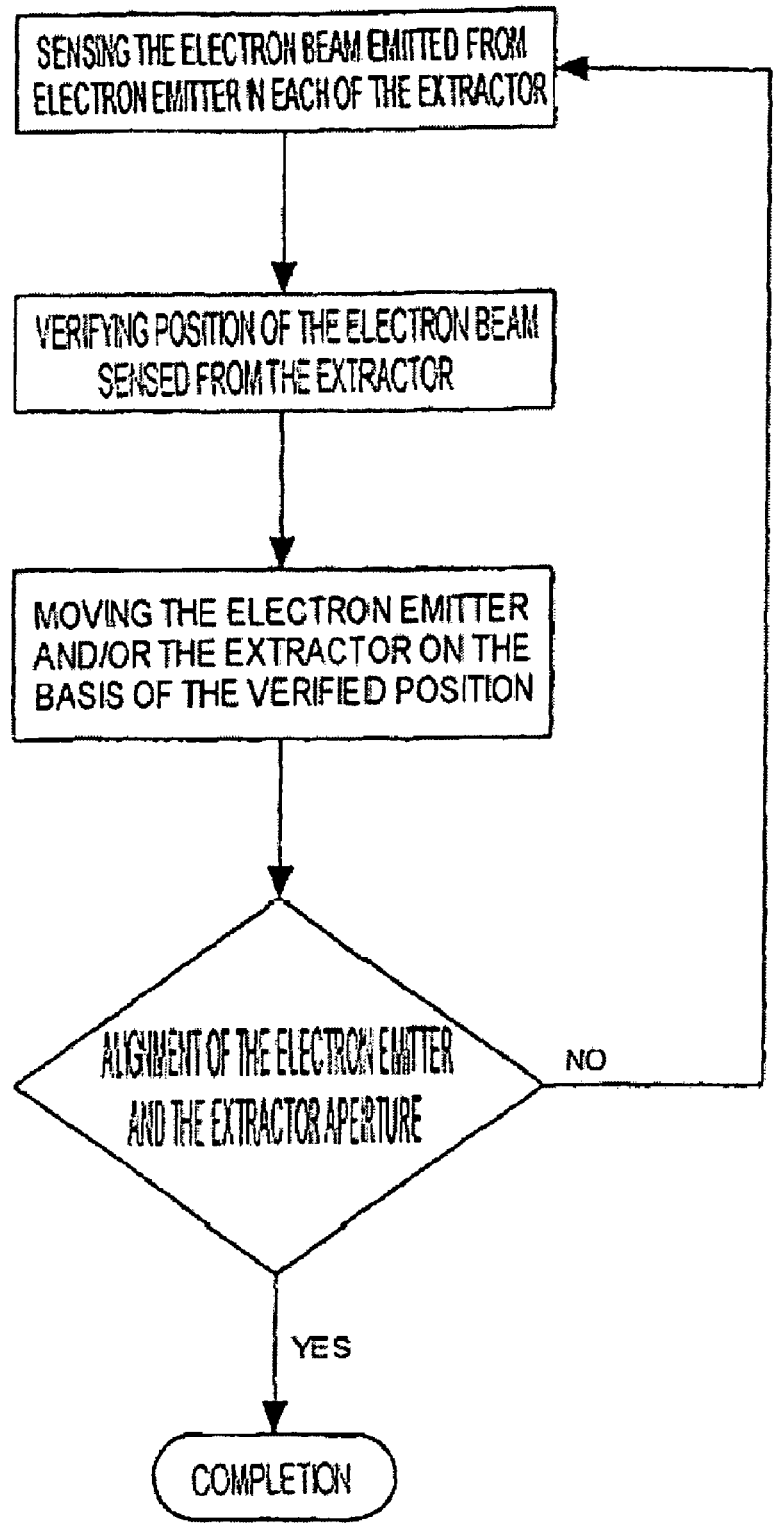
FIG. 2 is a flow chart for performing an automatic alignment method of the present invention.
Figure 3:
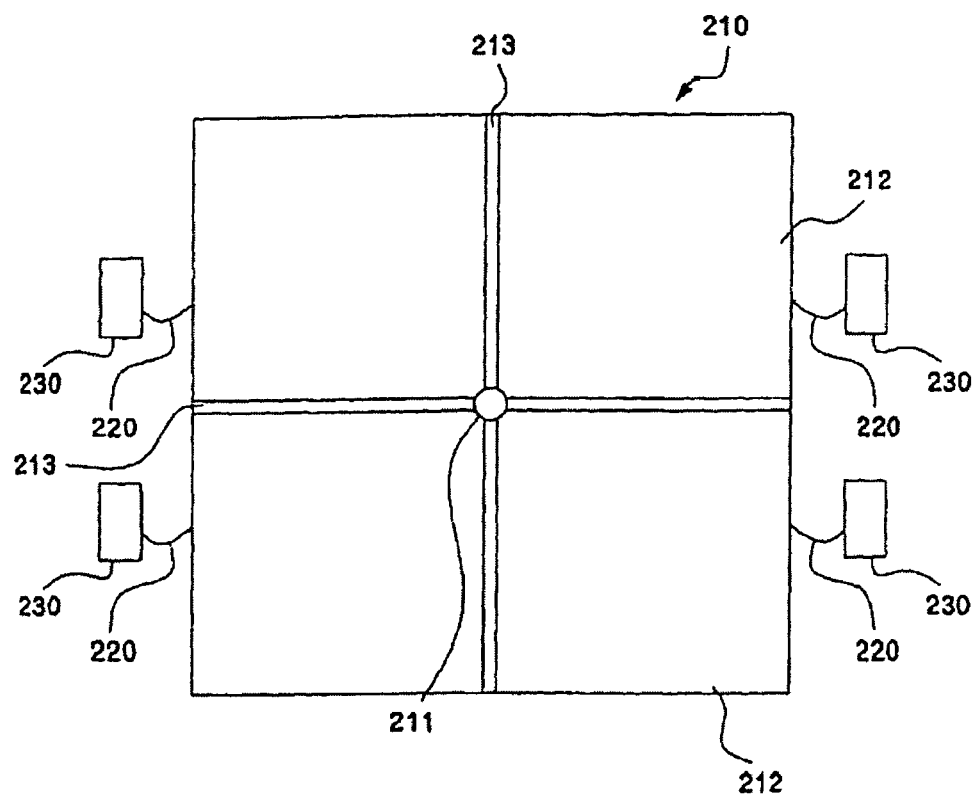
FIG. 3 is a planar view of a micro-column extractor in accordance with an embodiment of the present invention.
Figure 4:
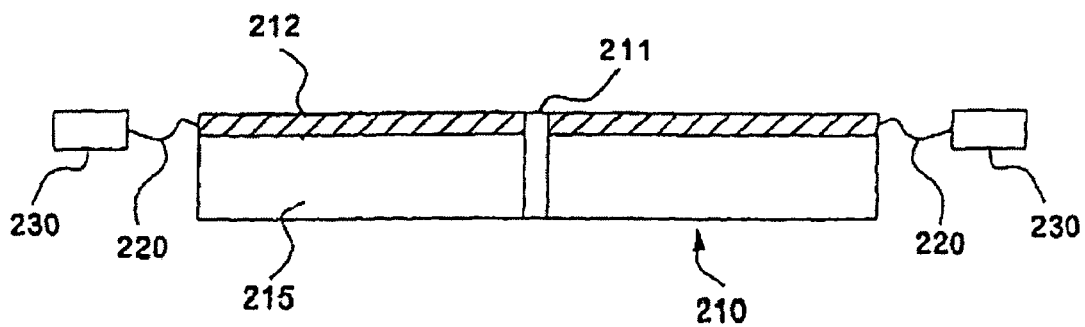
FIG. 4 is a cross-sectional view of FIG. 3.

Referring to FIGS. 2-4, FIG. 2 is a flow chart related to an automatic alignment of an extractor aperture with an electron emitter in accordance with the present invention, which shows each step of the alignment in order. FIG. 3 is a planar view of the extractor of a micro-column in accordance with an embodiment of the present invention. FIG. 4 is a cross-sectional view of the extractor shown in FIG. 3. The extractor 210 includes an extractor aperture 211 located at the center thereof and sensing zones 212 divided four pieces by insulating portions 213 which include four pieces of insulator or low-doped silicon disposed about the center. Each of sensing zones 212 is connected to a measuring device 230 by wires 220. The lower part of the sensing zones 212 includes low-doped semiconductor layer 215, such as the conventional low-doped silicon. The sensing zones 212 include a conducting layer, such as metal with high conductivity, or semiconductor layer, such as high-doped silicon. In this embodiment, the wires 220 are used as a connection means and only serve to send electrons of E-beam irradiated onto the respective sensing zone 212 to the respective measuring device 230. The measuring device 230 serves to determine the electrons flowing through the connection means and to measure the current. Thus, a device such as a galvanometer may be used. The insulating portions are disposed between each of the sensing zones 212 to interrupt or reduce the electrons flowing therebeween. The width of the insulating portion 213 is determined depending on the diameter of the electron beam emitted from the electron emitter 110. Because the scattered electron beam can be sensed in some degree within a portion of the sensing zones 212 adjacent to the insulating portion 213 even when the insulating portion 213 are irradiated by the electron beam, the width of insulating portion 213 should be defined in such a way that the electron beam can be sensed within the adjacent sensing zones 212. Thus, it may be differently selected depending on the object to be aligned and the electron emitter 110 of the system to be used. However, it is preferable to reduce the width of the insulating portion 213 to be as small as possible, because the insulating portion 213 may be charged with the electron beam and then discharged in some instances. Accordingly, it is preferable that the insulating portion 213 includes a semiconductor material, such as low-doped silicon, which cannot be easily charged with the electron beam. Also, even if the width of the insulating portion differs depending on the material used, it is preferable to minimize the width of the insulating portion enough to interrupt or reduce the electrons flowing between the sensing zones 212. Thus, the insulating portion 213 includes a semiconductor material, such as the conventional low-doped silicon.

Figure 5:
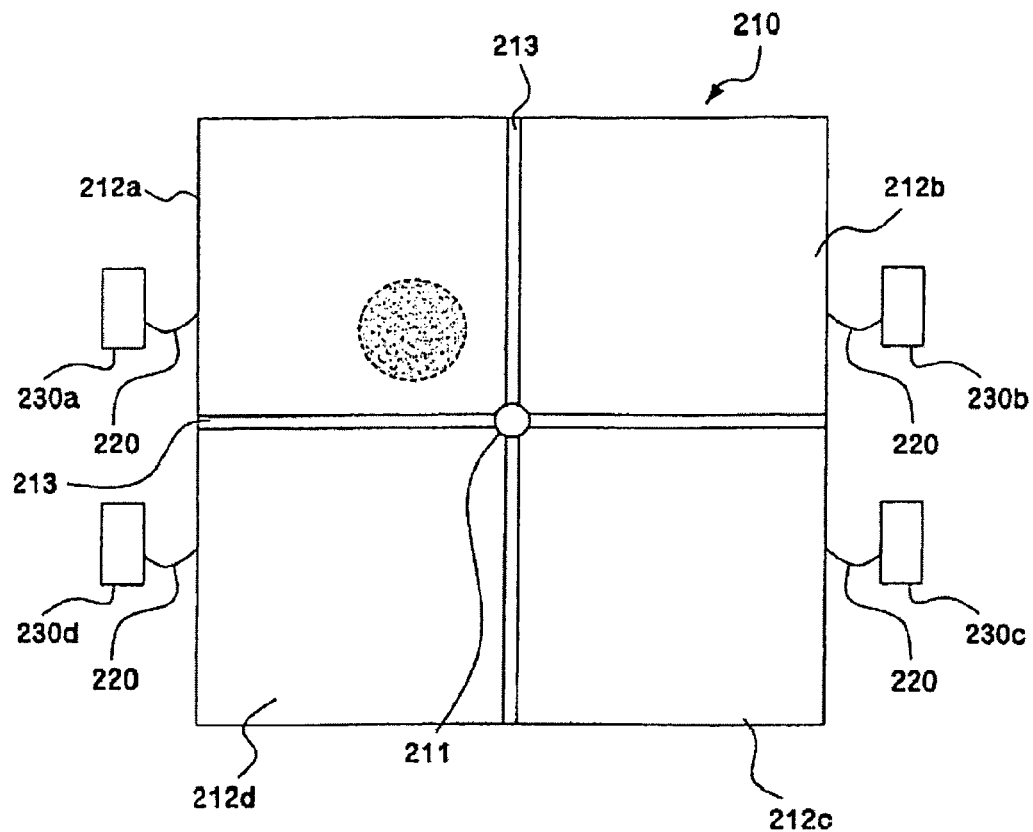
FIG. 5 is a planar view of the extractor of FIG. 3, showing that electrons emitted from an electron emitter irradiates the extractor.

FIG. 5 shows that the electron beam emitted from the electron emitter 110 irradiates on the extractor of FIG. 3. Referring to FIG. 5, the electron beam emitted from the electron emitter 110 irradiates on the sensing zone 212a located at the left-upper part of the extractor 210. Accordingly, the measuring device 230a corresponding to the sensing zone 212a senses electric current flow and measures amount of the electric current flow. By doing so, it possible to know which of sensing zones are irradiated and how much the irradiated amount is. If the electron beam irradiates both the left-and the right-upper parts of the sensing zones 212a and 212b, the measuring devices 220a, 230b determine the electric current flow and measure the amount of the electric current flow, respectively.

Also, if the electron beam irradiates near the center, measuring devices 230a, 230b, 230c, 230d, which corresponds to the sensing zones 212a, 212b, 212c, 212d, respectively, determine the electric current flow and measure the amount of the electric current flow.

Figure 6:
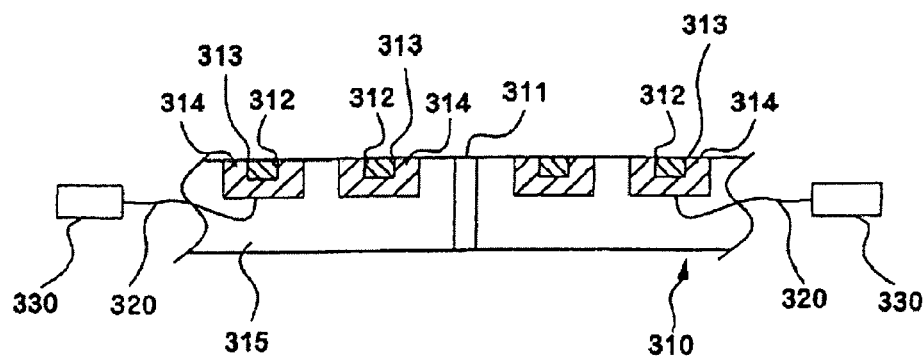
FIG. 6 is a cross-sectional view of another extractor included in the micro-column in accordance with the present invention.

FIG. 6 is another variant of the embodiment of FIG. 3, in which the sensing zones are finely separated more than those of the embodiment shown in FIG. 3 and the respective sensing zones 212 include a p-n junction portion so as to facilitate the determination of the electric current flow and the measurement of the amount thereof more than the conventional wires. In FIG. 6, an extractor 310 includes the typical p-n junction portion consisting of p-type semiconductor material denoted with 312, n-type semiconductor material denoted with 314, and a diffusion portion denoted with 313. The measuring device 330 corresponding to the p-n junction portion is connected by wire 320. The p-n junction is distinguished by the insulating portion 315.

No matter which of the extractors 210,310 will be used, each of the methods for aligning the extractor aperture 211 with the electron emitter 110 in accordance with the present invention is similar to each other in view of its principle, thus those alignment methods will be described with reference to embodiments illustrated in FIG. 2 and FIGS. 3-5.

Referring to the flow chart of FIG. 2 and FIG. 5, which show a method for aligning the extractor aperture 211 with the electron emitter 110, the electrons emitted from the electron emitter 110 are sensed in the left-upper sensing zone 212a. Accordingly, flow of the electrons and the amount thereof may be detected in the measuring device 230a. The extractor 210 may be moved in the upward or the leftward direction with a predetermined distance to align itself by the movement. If the electron emitter 110 is not correctly aligned with the extractor aperture 211, the electrons are sensed in the same and/or the other sensing zone 212. If the electrons are sensed in the same sensing zone, the extractor will be moved with the predetermined distance and the same process will be repeated. Otherwise, the electrons are sensed in the other sensing zone, the extractor will be moved in an opposite direction to the previously moved direction with a distance shorter than the previously moved distance. For example, the electrons are sensed in the right-lower sensing zone, the extractor will be moved in the rightward and downward directions and each of the moving distances in either one of the directions is shorter than the previously moved distances in the same directions. With the repetition of such process, the electron beam emitted from the electron emitter 110 will be rayed centering about either one of the horizontal or the vertical insulating portions 213, or will pass through the center of the extractor aperture 211. If the electron beams emitted from the electron emitter 110 are sensed in a plurality of the sensing zones 212a, 212b including the horizontal or the vertical insulating portions 213, the extractor 210 will be moved in the vertical direction of the center axis of the extractor aperture 211 so as to have the electron emitter 110 located at the center of the extractor aperture 211. If, with such movement, the electrons are sensed in a plurality of the sensing zones 212c, 212d including the opposite insulating portion 213 of the extractor 210, the extractor 210 will be moved with the distance shorter than the previously moved distance. With the repetition of such process, the center of the extractor aperture 211 may be aligned with the electron emitter 110. Even though only the extractor 210 has been described herein to be moved, same results may be obtained with the movement of only the electron emitter 110 or with the simultaneous movement of the electron emitter 110 and the extractor 210 in predetermined directions and distance, since those are relatively located to each other. With the repletion of such process mentioned above, the extractor aperture 211 and the electron emitter 110 are located on the same axis. Afterward, in order to adjust height gap between the extractor aperture 211 and the electron emitter 110, the extractor 210 and/or the electron emitter 110 may moves up or down. Such can be performed by the following process for verifying the alignment of the electron emitter 110 and the extractor aperture 211.

Verification of the alignment of the electron emitter 110 with the extractor aperture 211 may be differed depending on the sizes of the electron beam and the extractor aperture 211. When the size of the extractor aperture 211 is significantly larger than that of the electron beam, a flow of the electrons is not sensed in any each sensing zones. In general, however, since the electrons flow from the electron emitter with the spread-out distribution, the electrons in each sensing zone 212 of the extractor 210 will be sensed uniformly. In other words, the amount of the currents measured in each of the measuring devices 230 will be same to each other, or the differences thereof will be within allowable ranges. As such, the electron emitter 110 and the extractor aperture 211 are located on the same axis. In this state, the distance between the extractor aperture 211 and the electron emitter 110 can be measured by measuring the amount of the current in each of the measuring devices 230. Because the electron beam spreads with radial distribution, the amount of the current measured in the measuring device 230 varies depending on the distance between the electron emitter 110 and the extractor aperture 211 on the condition that the electron beam emits uniformly. Thus, if the data related to the amount of the current are provided beforehand, the alignment in the vertical direction can be sufficiently verified. In other words, if the amount of the current measured in the measuring device 230 is smaller than the reference amount; the gap should be narrowed and vice-versa.

Accordingly, when the electron emitter 110 and the extractor aperture 211 are not aligned to each other, the alignment there-between can be automatically carried out with the repetition of each step, which ranges from the step for detecting the electron beam emitted from the electron emitter 110 at the extractor 210 to the step for verifying the alignment of the electron emitter 110 with the extractor aperture 211.

In this embodiment, it is possible to reduce the time for alignment by subdividing the sensing zones 212. The more subdivided the sensing zones are, the more accurate the data related to the relative distance between the electron emitter 110 and the extractor aperture 211 becomes. In other words, with a use of the relative coordinate data obtained by measuring the striking amount of the electrons in the sensing zones 212, the alignment in the vertical and the horizontal direction can be carried out at the same time.

Also, instead of the measuring devices 230 corresponding to the sensing zones 212, a semiconductor circuit on a lower part of a metal membrane can be used. With such, it is possible to easily and simply verify which sensing zone is sensing electrons in other words, various kinds of means for sensing current flow can be incorporated into the extractor 210 so as to make it possible to perform the method of the present invention Also, although the above-stated extractors 210,310 have been illustrated herein in the rectangular shape, the other shapes, such as circular shape, and etc. may be employed, if necessary.

It should be noted that the above-described methods for aligning the electron emitter with the extractor aperture are no more than the embodiments. Although the sensing zones are divided into four segments, those skilled in the art may divide them into any number of segments. Further, with respect to the moving distance of the extractor in accordance with the location of the electron beam sensed in the sensing zones, even though the operator may predetermine the moving distance beforehand and simply repeat the process, he can control the moving distance every time by making use of the computer program so as to reduce the repetition times of each step. In the extractor of the second embodiment, in order to verify the locations on which the electrons strike, the amount of the current due to the electron's strike may be measured. Otherwise, the principle of the p-n junction may be used. By doing so, it is possible to reduce the time for alignment. As such, the way for sensing the electron beam emitted from the electron emitter at the extractor is to use the principle of the p-n junction or to sense the strike of the electrons. Preferably, since it is possible to measure the current flow or to use the principle of the p-n junction, those skilled in the art will be able to embody the present invention in many ways. Those ways can be employed for the generally used electron-column. However, even though the extractor may be applied in many configurations, the method for automatically aligning the electron emitter with the extractor aperture will be embodied in accordance with the present invention.

FIGS. 7-9 and FIG. 11 are similar to FIGS. 3-6. In those former drawings, the extractor aperture 211 is not shown at the center because it is not essential.

Figure 7:
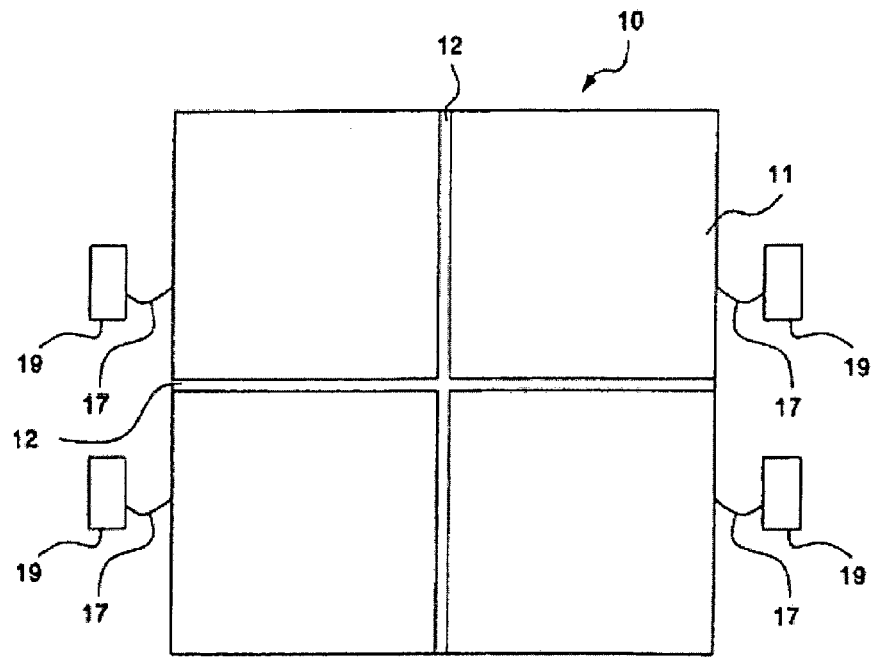
FIG. 7 is a planar view of an electron beam measuring device in accordance with the present invention.
Figure 8:
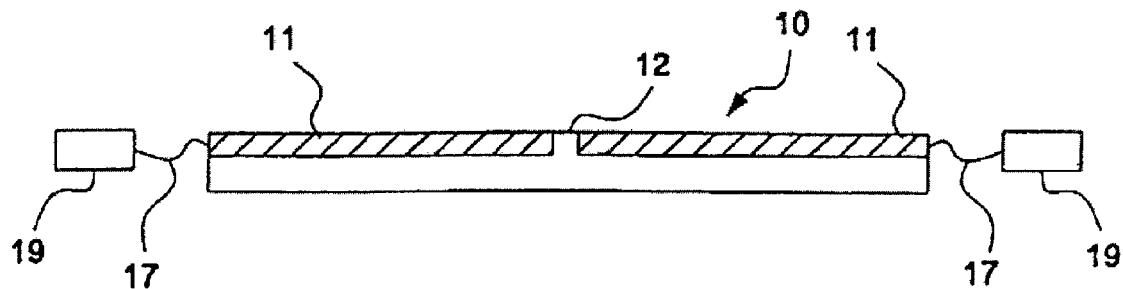
FIG. 8 is a cross-sectional view of the embodiment shown in FIG. 7.

Referring to FIGS. 7 and 8, FIG. 7 is a planar view of a electron beam measuring device in accordance with the present invention and FIG. 8 is a cross-sectional view of FIG. 7. The components shown in FIGS. 7 and 8 correspond to those in FIGS. 3 and 4, respectively. In other words, the electron beam measuring device 10 corresponds to the extractor 210, four sensing zones 11 to the sensing zones 212, the insulating portion 12 to the insulating portion 213, and the wire 17 to the wire 220. Only exception is that the electron beam measuring device 10 does not include the extractor aperture 211 at the center because the electron beam does not have to pass there-through. Thus, save the extractor aperture 211, the elements of this embodiment correspond to those illustrated in FIGS. 3 and 4. Accordingly, the detailed description related to the sensing zone 11, the wire 17, the measuring device 19 and the insulating portion 12 will be skipped. However, since the discharge at the insulating portion 12 is so instantaneous, the instantaneous variation of the current flow may be sensed in the measuring device 19. If neglecting such variation, other problems will not occur.

Figure 9:
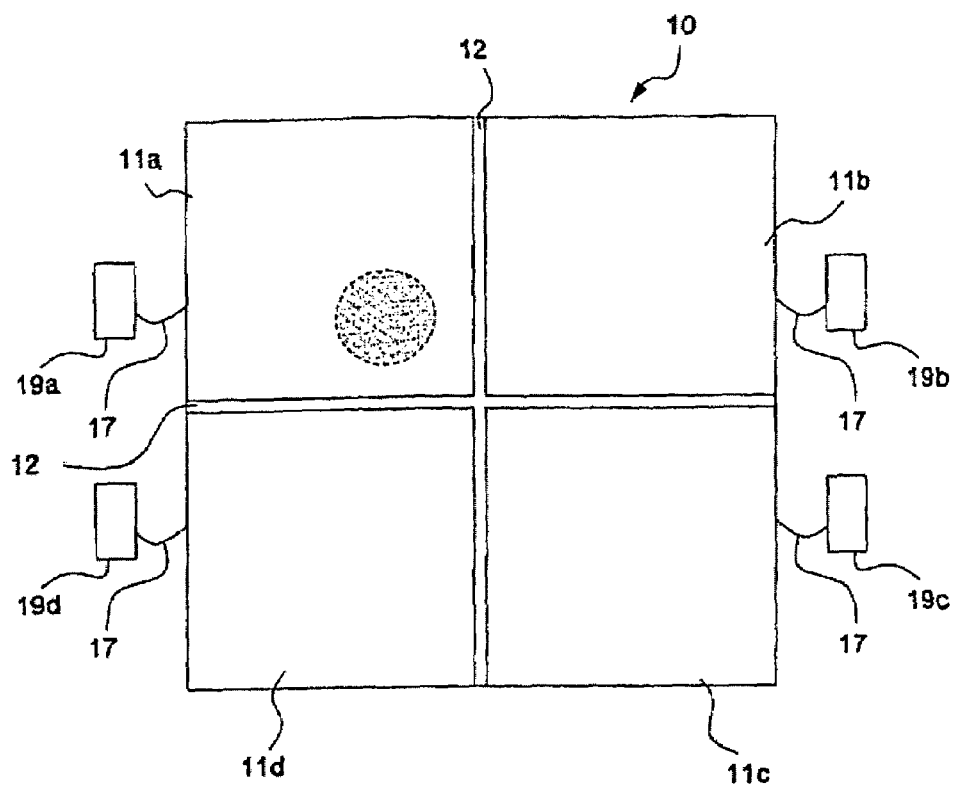
FIG. 9 is a planar view of the embodiment shown in FIG. 7.

FIG. 9 shows an irradiation of the electron beam emitted from the electron emitter (not shown) onto the electron beam measuring device 10, which is similar to FIG. 5. The electron beam measuring system of the present invention may be described with reference to FIG. 9 and the description related to FIG. 5 may be applied similarly. Accordingly, the description related to FIG. 9 will be skipped so as to avoid the repetition. In FIG. 9, the electron emitter is not shown, but a typical electron gun may be used as the electron emitter. As illustrated in FIG. 9, the electron emitter emits the electron beam in the conical form. However, an electron emitter used in the electron beam micro-column is preferably used for ultra-small and ultra-accurate verification of the location and/or the control.

Figure 10:
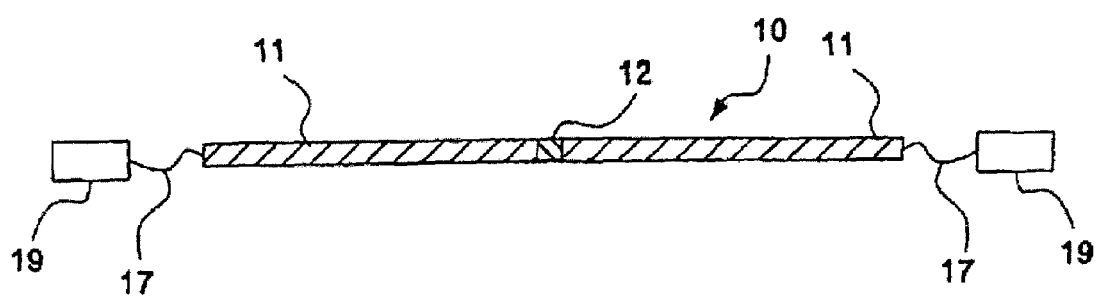
FIG. 10 is a cross-sectional view of a variant for the embodiment shown in FIG. 7.

FIG. 10 is a variant of FIG. 7, wherein the sensing zones are divided by the insulating portions 12 so as to reduce the width of the electron beam measuring device 10. In other words, parts between the sensing zones 11 are made by attachment of the insulating portion, so that the width of the electron beam measuring device 10 can be minimized. Also, the aperture of the extractor can be made in FIG. 10.

Figure 11:
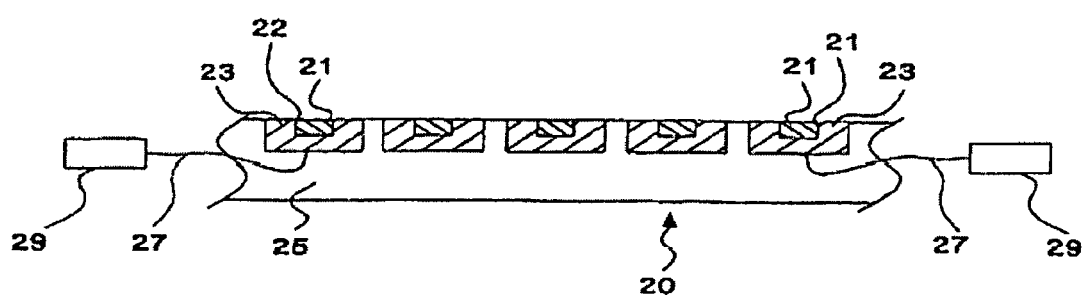
FIG. 11 is a cross-sectional view of another variant for the embodiment shown in FIG. 7.

FIG. 11 is another variant of FIG. 7 and corresponds to FIG. 6. The sensing zones are subdivided more than those in FIG. 7 and each of the sensing zones 11 includes p-n junctions so as to facilitate the verification of the current flow and the measurement of the current amount in comparison to the general conductor. In FIG. 11, the electron beam measuring device 20 includes p-type semiconductor material denoted by 21, n-type semiconductor material denoted by 23, and typical p-n junctions having diffusions denoted by 22, and the measuring devices 29 corresponding to each p-n junction are connected via the wires 27. Each of p-n junctions is distinguished by the insulating portions 25.

Any of the locating and controlling methods using the electron beam measuring device 10,20 of the present invention is similar to each other in respect of the principle, no matter which of the electron beam measuring devices 10,20 are used. Accordingly, it will be appreciated that the detailed description of such method can be achieved with reference to the embodiment illustrated in FIGS. 7 and 8, and will be similar to that in FIGS. 3 and 4. In the following description, the object to be measured or aligned and the electron emitter are not shown. In practice, however, the electron emitter should be located at a first side of the object to be measured and aligned, and the electron beam measuring device should be located at a second side of the object. In the method for verifying the relative location of the object and the alignment thereof, for the convenience of the description, the first side refers to the electron emitter and the second side to the electron beam measuring device. Fixation of the object, the electron emitter, and the electron beam measuring device may be permanent or temporary. When the micro-column technology is employed, a permanent fixation can be achieved with ease because the electron emitter and the electron beam measuring device may be down-sized to several micrometers. Of course, the temporary fixation will be possible using a clamp, but the permanent fixation uses preferably adhesive, bolts and clamp for continuous measurement and alignment.

In FIG. 8, the electrons emitted from the electron emitter are sensed in the left-upper sensing zones 11a. Accordingly, the flow and the amount of the current are verified in the measuring device 19a. The alignment between the electron emitter and the electron beam measuring device 10 may be achieved with the movement of the electron emitter and/or the electron beam measuring device 10 using a positioning means adapted to the each situation. Preferably, with a use of the positioning means, such as the positioner of the electron beam micro-column, ultra-small and ultra-accurate movement is possible. In the following, the electron beam measuring device 10 will be described as to be moved. In this case, the electron beam measuring device 10 moves leftward and upward a predetermined distance. If the centers of the electron emitter 110 and the electron measuring device 10 are not accurately coincident to each other, the electrons are sensed again in the same and/or the other sensing zones 11. If the electrons are sensed in the same sensing zone, the electron beam measuring device will be moved a predetermined distance and the same process will be repeated. Otherwise, the electrons are sensed in the other sensing zones, the electron beam measuring device will be moved in an opposite direction to the previously moved direction a distance shorter than the previous distance. For example, electrons are sensed in the right-lower sensing zone 11 C, the electron beam measuring device 10 will be moved in the rightward and downward directions. With the repetition of such process, the electron beam emitted from the electron emitter 110 will be rayed centering about either one of the horizontal or the vertical insulating portions 12, or will be rayed onto the center of the electron beam measuring device 10. If the electron beams emitted from the electron emitter 110 are sensed in a plurality of the sensing zones 11 including the horizontal or the vertical insulating portions 12, the electron beam measuring device 10 will be moved toward the center of the electron beam measuring device 10 so as to position the electron emitter 110 at the center of the electron beam measuring device 10.

If, with such movement, the electrons are sensed in a plurality of the sensing zones 11, including the insulating portion 12 opposite to the electron beam measuring device 10, the electron beam measuring device 10 will be moved in the opposite direction a distance shorter than the previously moved distance. With the repetition of such process, the center of the electron beam measuring device 10 may be aligned with the electron emitter 110. Even though only the electron beam measuring device 10 has been described herein to be moved, same results may be obtained with the movement of the electron emitter 110, or with the simultaneous movement of the electron emitter, 110 and the electron beam measuring device 10 a predetermined direction and the distance, since those are located relatively to each other. With the repeated application of such process mentioned above, the electron emitter will be located at the center of the electron beam measuring device.

With regard to verification of alignment between the electron emitter and the electron beam measuring device 10, the amount of the current flow will be uniform in each of sensing zones 11a, 11b, 11 C, 11 D of the electron beam measuring device 10 since the electrons emitted from electron emitter flow with spread-out distribution. In other words, if the amounts of the current flow measured in each of the measuring devices 19a, 19b, 19c, 19d are identical to each other or within an allowed range, the alignment can be verified. As such, the centers of the electron emitter and the electron beam measuring device 10 are to be concentric.

In this state, the distance between the electron beam measuring device 10 and the electron emitter can be measured by measuring the amount of the current flow in each of the measuring devices 19. In this specific embodiment, however, the measurement of the distance may be difficult because each of the sensing zones 11 is divided into four segments. Otherwise, if each of the sensing zones 11 of the electron beam measuring device 10 is subdivided and the electrons emitted from the electron emitter are uniform, the measurement of the distance may be possible through the beforehand information of the electron beam's characteristics, because the amount of the current flow sensed in the measuring device 19, the number of the sensing zones 11, and the amount of the electrons striking the sensing zones 11 are changed in accordance with the distance between the center of the electron beam measuring device 10 and the electron emitter. With the provision of the hole at the center of the electron beam measuring device, only four sensing zones 11 make it possible to measure the distance. It is because the amount of the current flow passing through the center hole of the electron beam measuring device 10 has changed in accordance with the distance between the electron beam measuring device 10 and the electron emitter. Thus, with the provision of data regarding the amount of the current flow sensed in the sensing zones 11, the alignment in the vertical direction can be sufficiently verified. In other words, the amount of the current flow measured in the measuring device 19 is lower than the reference value, the distance should be narrowed and vice-versa. Accordingly, the electron beam measuring device 10 and/or the electron emitter will be moved up and down so as to adjust the height distance between the electron beam measuring device 10 and the electron emitter using height data.

In an automatic aligning method, the alignment between the electron emitter and the electron beam measuring device will be verified after the movement of the electron emitter and/or the electron beam measuring device. In case of the misalignment; the above-stated process is repeated using the position data related to the distance between the electron beam measuring devices 10, so that the alignment between the electron emitter and the electron beam measuring devices 10 may be automatically achieved.

With the provision of the above-described method for alignment, it is possible to perform alignment along the X-Y-Z directions and the position control of the object to be aligned. In the embodiments of the present invention, the more subdivided the sensing zones are, the more accurate the data regarding the relative position between the electron emitter and the electron beam measuring device become, so with the enough subdivisions it is possible to instantly verify the alignment and to reduce the duration needed for alignment. In other words, it is possible to perform the alignments both in the vertical and the horizontal direction at the same time using the relative coordinate data, which are obtained by measuring the amount of the electrons striking the sensing zones. Also, since the amount of the electrons striking each of the sensing zones and the number of the sensing zones being in a state of currently sensing the electrons will be changed in accordance with the changes in the inclination of the electron beam measuring device, it is possible to adjust the inclination properly.

Also, instead of the measuring devices 19 corresponding to each of the sensing zones 11, a semiconductor circuit provided under the metal layer may be used so as to facilitate sensing operations in the sensing zones. In other words, various kinds of sensing means for sensing the current low may be incorporated so as to carry out the above-stated method of the present invention.

Also, although each of the electron beam measuring devices 10,20 has a rectangular shape in the drawings, they may be formed with different shape, such as a circular shape, if necessary.

The measuring system, the measuring method, and the alignment method using the above-described electron emitter and the electron beam measuring device are no more than an embodiment. Those skilled in the art will be able to reach various kinds of embodiments on the basis of the above detailed description. In other words, various kinds of materials can be used for correctly sending the amount of the current flow sensed in each sensing zone to the measuring device. Instead of wire used as the connection means between the sensing zones and the measuring device, a direct contact therebetween may be provided. Otherwise, the relative amount of the current flow in the form of converted and amplified signals may be measured in the measuring device.

Many kinds of method can be applied to the system of the present invention in accordance with the situation. In other words, the system and the method of the present invention may be varied and embodied into different constructions and methods: within the scope of the present invention in accordance with the situation. Also, in the embodiment illustrated in FIG. 7, the sensing zones are divided into four segments, but those skilled in the art will be able to divide the sensing zones into a plurality of segments more than four in accordance with the situation. If the data related to the location of the sensing zones sensed in each of the sensing zones and the relative location of the sensing zones based on the amount of the current flow are provided, those skilled in the art will be able to verify the relative location and the moving distance of the object using such data and to calculate the relative location and the moving distance more accurately using the computer program. Accordingly, the repetition times of each step may be reduced by accurately calculating the moving distance in each step of alignment.

INDUSTRIAL APPLICABILITY

In the method for aligning the extractor aperture of the micro-column with the electron emitter in accordance with the present invention and the extractor of the present invention, it is possible to align the extractor aperture with the electron emitter in automatic manner using the novel extractor of the present invention. Further, unlike the conventional alignment method in which the extractor aperture is aligned with the tip of the electron emitter, the present invention includes the method in which the alignment can be achieved only by passing the electron beam emitted from the electron emitter through the center of the extractor aperture. Accordingly, while operating the micro-column, the central axis of the electrons emitted from the tip of the electron emitter exactly passes through the central axis of the extractor aperture, so that the efficiency of the micro-column can be maximized and the time and cost for preparing the operation of the micro-column can be reduced due to automatic alignment.

Further, it is possible to sense the variation in the alignment between the electron emitter and the extractor aperture occurring after a long-term use of the micro-column and to calibrate such variation.

With the use of the system and the method in accordance with the present invention, it is possible to facilitate the relative positioning and/or the alignment of the object. Also, automatic alignment of the object will be possible. If the system of the present invention is fixed to the object, the relative position of the object can be measured and controlled in real time. Accordingly, it is very convenient to control the object when the relative position of the object varies depending on time.

Those skilled in the art will appreciate that although the present invention is described with reference to the certain embodiment, the latter is provided for the illustrative purpose and should not be construed to limit the present invention. Also, various modification and variants are possible without departing from the scope and spirit of the invention as disclosed in the accompanying claims.

What is claimed is:

1. An extractor for use in a micro-column, said extractor comprising:
   a plurality of sensing regions on which electrons of an electron beam strike and being electrically conductive;
   insulating portions including insulating material for prevention of the electron flow or low-doped semiconductor for reduction of the electron flow and dividing each of said sensing regions, and
   an aperture configured in the extractor, corresponding to the axis of an emitter, so that electrons from the emitter can be passed through wherein the magnitude and the direction of misalignment of an aperture of the extractor with an electron emitter of the micro-column is determined by measuring and calculating the amount of the electrons on each of the sensing regions.

2. The extractor for use in the micro-column as claimed in claim 1, wherein said sensing regions include conductive material, such as metal or high-doped semiconductor.

3. The extractor for use in the micro-column as claimed in claim 1, wherein said sensing regions include p-n junctions.

4. A method for aligning an aperture configured in the extractor, corresponding to the axis of an emitter, with an electron emitter of the micro-column, the method comprising steps of:
- sensing the electron beam emitted from the electron emitter at each of the sensing regions of the extractor as claimed in claim 1;
- verifying the position of the sensing region being in a state of currently sensing electrons and the amount of the current flow;
- calculating the relative position between the extractor aperture and the electron emitter on the basis of the verified sensing region and the amount of the current flow; and
- moving said electron emitter, said extractor, or said electron emitter and said extractor according to said calculated data.

5. The method as claimed in claim 4, wherein the method further comprises a step of comparing the data calculated in said calculating step to previously-calculated data relating to alignment of the electron emitter with the extractor aperture, wherein if the alignment of the electron emitter with the extractor aperture is not attained, each steps will be repeated from the step of sensing, and wherein if the alignment of the electron emitter with the extractor aperture is attained, all the steps will be terminated.

6. A position measuring system using electron beam measurement, said system comprising:
- an electron emitter;
- an electron beam measuring device including a plurality of sensing regions through which the electrons of the electron beam can be electrically transmitted, and insulating portions including insulating material for prevention of the electron flow or low-doped semiconductor for reduction of the electron flow and dividing each of the sensing regions;
- connecting portions for electrically conducting the electrons striking on each of the sensing regions; and
- measuring portions connected to each of the corresponding sensing regions via said connecting portions and measuring the amount of the electron beam sensed in each of said sensing regions,
- wherein the magnitude and the direction of misalignment of an electron beam measuring device with an electron emitter is determined by measuring and calculating the amount of the electrons on each of the sensing regions.

7. The position measuring system as claimed in claim 6, wherein said sensing regions include conductive material, such as metal or high-doped semiconductor.

8. The position measuring system as claimed in claim 6, wherein said sensing regions include p-n junctions.

9. A method for measuring position using electron beam measurement, said method comprising steps of:
- providing an electron emitter at a first side of an object to be measured;
- providing an electron beam measuring device at a second side of the object to be measured, said electron beam measuring device including a plurality of sensing regions through which the electrons of the electron beam can be electrically transmitted, and insulating portions including insulating material for prevention of the electron flow or low-doped semiconductor for reduction of the electron flow and dividing each of the sensing regions;
- sensing the electrons emitted from said electron emitter in each of the sensing regions;
- verifying position of the sensing regions being in a state of sensing the electrons in said electron beam measuring device and calculating the amount of the electrons striking each of the sensing regions; and
- calculating relative position of the first and the second sides on the basis of the measured data related to the position of each of the sensing regions being in a state of sensing the electrons and the striking amount of the electrons.

10. An alignment method using electron beam measurement, said method comprising steps of:
- providing an electron emitter at a first side of an object to be aligned;
- providing an electron beam measuring device at a second side of the object to be aligned, said electron beam measuring device including a plurality of sensing regions through which the electrons of the electron beam can be electrically transmitted, and insulating portions including insulating material for prevention of the electron flow or low-doped semiconductor for reduction of the electron flow and dividing each of the sensing regions; sensing the electrons emitted from said electron emitter in each of the sensing regions;
- verifying position of the sensing regions being in a state of sensing the electrons in said electron beam measuring device and calculating the amount of the electrons striking each of the sensing regions;
- calculating relative position of the first and the second sides on the basis of the measured data related to the position of each of the sensing regions being in a sensing state and the striking amount of the electrons; and
- moving either one of the first or second side, or both the first and second sides on the basis of the verified relative position.

11. The alignment method as claimed in claim 10, wherein the method further comprises a step of comparing the data calculated in said calculating step to previously-calculated data relating to alignment of the electron emitter with the extractor aperture, wherein if the alignment of the electron emitter with the extractor aperture is not attained, each step will be repeated from said step of sensing, and wherein if the alignment of the electron emitter with the extractor aperture is attained, all the steps will be terminated.

12. A method for aligning an extractor aperture with an electron emitter of the micro-column, the method comprising steps of:
- sensing the electron beam emitted from the electron emitter at each of the sensing regions of the extractor as claimed in claim 2;
- verifying the position of the sensing region being in a state of currently sensing electrons and the amount of the current flow;
- calculating relative position between the extractor aperture and the electron emitter on the basis of the verified sensing region and the amount of the current flow; and
- moving said electron emitter, said extractor, or said electron emitter and said extractor according to said calculated data.

13. A method for aligning an extractor aperture with an electron emitter of the micro-column, the method comprising steps of:
   sensing the electron beam emitted from the electron emitter at each of the sensing regions of the extractor as claimed in claim 3;
   verifying the position of the sensing region being in a state of currently sensing electrons and the amount of the current flow;
   calculating relative position between the extractor aperture and the electron emitter on the basis of the verified sensing region and the amount of the current flow; and
   moving said electron emitter, said extractor, or said electron emitter and said extractor according to said calculated data.

\* \* \* \* \*